(12) United States Patent
Yoshida

(10) Patent No.: US 9,238,303 B2
(45) Date of Patent: Jan. 19, 2016

(54) TRANSFER POSITION TEACHING METHOD, TRANSFER POSITION TEACHING APPARATUS AND SUBSTRATE PROCESSING APPARATUS

(71) Applicant: DAINIPPON SCREEN MFG. CO., LTD., Kyoto (JP)

(72) Inventor: Takeshi Yoshida, Kyoto (JP)

(73) Assignee: SCREEN Holdings Co., Ltd. (JP)

(*) Notice: Subject to any disclaimer, the term of this patent is extended or adjusted under 35 U.S.C. 154(b) by 96 days.

(21) Appl. No.: 14/087,331

(22) Filed: Nov. 22, 2013

(65) Prior Publication Data

US 2014/0222202 A1    Aug. 7, 2014

(30) Foreign Application Priority Data

Feb. 4, 2013   (JP) .................................. 2013-019312

(51) Int. Cl.
   *B25J 9/16*    (2006.01)
   *H01L 21/67*   (2006.01)
   *H01L 21/68*   (2006.01)

(52) U.S. Cl.
   CPC ........... *B25J 9/163* (2013.01); *H01L 21/67265* (2013.01); *H01L 21/682* (2013.01)

(58) Field of Classification Search
   CPC .................. H01L 21/67778; H01L 21/67265; H01L 21/67775; H01L 21/682; H01L 21/68735; G05B 19/402
   USPC .......................................................... 414/936
   See application file for complete search history.

(56) References Cited

U.S. PATENT DOCUMENTS

| | | | |
|---|---|---|---|
| 5,898,285 A * | 4/1999 | Nagasawa et al. | 318/568.13 |
| 6,543,980 B2 * | 4/2003 | Lin et al. | 414/160 |
| 6,996,456 B2 * | 2/2006 | Cordell et al. | 700/258 |
| 7,361,920 B2 * | 4/2008 | Kondoh | 250/559.12 |
| 7,706,919 B2 * | 4/2010 | Adachi et al. | 700/254 |
| 7,933,665 B2 * | 4/2011 | Sakiya et al. | 700/57 |
| 2007/0001638 A1 * | 1/2007 | Gray et al. | 318/568.11 |
| 2009/0319216 A1 * | 12/2009 | Ogata | 702/94 |
| 2010/0222923 A1 * | 9/2010 | Matsumura | 700/245 |
| 2011/0118873 A1 | 5/2011 | Hashimoto et al. | 700/245 |
| 2012/0118083 A1 * | 5/2012 | Mori et al. | 73/864.91 |

FOREIGN PATENT DOCUMENTS

| | | | |
|---|---|---|---|
| JP | 2007-080960 A1 | 3/2007 | |
| WO | WO 2010/004635 A1 | 1/2010 | |

* cited by examiner

*Primary Examiner* — Khoi Tran
*Assistant Examiner* — Ryan Rink
(74) *Attorney, Agent, or Firm* — Ostrolenk Faber LLP

(57) ABSTRACT

The transfer position teaching apparatus is provided with a teaching substrate having a shape identical to a semiconductor wafer to be processed by substrate processing apparatuses and having an electrically conductive coating thereon. The transfer position teaching apparatus is also provided with a base member having insulator coating thereon and on the base member, entrance contact members, Y-direction contact members, X-direction contact member are vertically arranged.

5 Claims, 20 Drawing Sheets

TRANSFER POSITION TEACHING METHOD, TRANSFER POSITION TEACHING APPARATUS AND SUBSTRATE PROCESSING APPARATUS

BACKGROUND OF THE INVENTION

1. Field of the Invention

The present invention relates to: a transfer position teaching method of teaching a hand for transferring a substrate to a substrate transfer member a transfer position of the substrate; a transfer position teaching apparatus for teaching a transfer position of a substrate; and a substrate processing apparatus having a hand for which teaching of a transferring position is made by the transfer position teaching apparatus or the transfer position teaching apparatus.

2. Description of Related Art

There are cases where substrates such as glass substrates for organic light emitting displays, glass substrates for liquid crystal displays, panel displays for solar cells, glass substrates for plasma displays, glass substrates for photo masks, substrates for optical disks, substrates for semiconductor wafers are supplied in a stacked condition in a substrate-storing container in a substrate processing apparatus. For example, in a substrate processing apparatus processing semiconductor wafers, semiconductor wafers are carried into the substrate processing apparatus being stored in a container so called FOUP (Front Opening Unified Pod) and carried out of the substrate processing apparatus. Herein "FOUP" refers to a hermetically closed-type storing pod for semiconductor wafers in conformity with SEMI (Semiconductor Equipment and Materials Institute) standards.

In order to precisely execute a transfer of a substrate between a substrate-storing container as such and a hand as a transfer mechanism for substrates, it is required that accuracy of transfer of substrates by the hand be improved. For this reason, it is required to execute a teaching process of transfer positions called "teaching" in order to identify and store transfer positions of substrates by the hand.

Conventionally, in order to conduct teaching of transfer positions of semiconductor wafer, teachings are conducted by setting a dummy semiconductor wafer on a hand and then visually recognizing positional relationship between the semiconductor wafer and FOUP or jig comparable to FOUP.

International publication 2010/004635 describes a teaching method for robots in which a wafer is caused to contact an inner wall face of a cassette to detect a point at which angular change of servo motor begins based from positional changes for an encoder, thereby detecting posture of the robot arm and angular position of shaft at the time.

In cases that a teaching of a transfer position of a semiconductor wafer, it is required to operate a hand while visually recognizing a gap between the semiconductor wafer on the hand and a FOUP. For this reason, it is difficult to recognize the positional relationship between the semiconductor wafer and the FOUP. Also, output may be uneven among operators. Therefore, it is difficult to accurately teach transfer positions of semiconductor wafer.

Also, in order to conduct a teaching of transfer positions of a wafer by detecting a contact between the wafer and a cassette with a robot for transferring wafers as described in international publication 2010/004635, it is required that the robot is provided with such detection mechanism. Thus it is not possible to conduct this type of teaching on existing substrate processing apparatuses.

SUMMARY OF THE INVENTION

It is an object of the present invention to solve the above-mentioned problems and provide a transfer position teaching method, a transfer position teaching apparatus and a substrate processing apparatus capable of precisely teaching a hand in existing substrate processing apparatus a transfer position of a substrate.

A substrate processing method according to a preferred embodiment of the present invention comprises: a placing step of placing a detection member for detecting a contact position of contact between the detection member and a teaching substrate when the hand supports and transfers the teaching substrate to the substrate transfer member in place of the substrate to be transferred; a supporting step of supporting the teaching substrate by the hand; a transferring step of moving the hand supporting the teaching substrate; and a transfer position identification step of identifying and storing the transfer position of the substrate based on the contact position of contact between the teaching substrate and the detection member.

According to the preferred embodiment of the invention, the utilization of contacts between a teaching substrate and a detection member permits a precise teaching of transfer positions of a substrate. By using a teaching substrate and a detection member, it is possible to teach a hand in an existing substrate processing apparatus a transfer position of substrates.

Preferably, the substrate transfer member is a substrate-storing container for storing a plurality of substrates in a stacked condition. With this, it is possible to precisely teach a hand a transfer position of substrates toward a substrate-storing container for storing substrates in a stacked condition.

Also preferably, teaching of transfer positions of the substrate are conducted for each of substrate-storing positions at the uppermost part of the substrate-storing container and a substrate-storing position at the lowermost part of the substrate-storing container. And thereby it is possible to precisely transfer substrate to all of the storing positions of the substrate-storing container storing substrates in a stacked condition by teaching transfer positions of substrates at the uppermost part and the lowermost part of the substrate-storing container.

Also preferably, a substrate processing apparatus comprises a hand for which teaching of a transfer position is made by the transfer position teaching method.

A transfer position teaching apparatus according to another preferred embodiment of the present invention comprises: a substrate transfer member; a hand for transferring the substrate to the substrate transfer member; a teaching substrate supported by the hand in place of the substrate to be transferred to the substrate transfer member; and a detection member, placed at a position corresponding to the substrate transfer member to detect a contact position of contact between the teaching substrate and the detection member. According to another preferred embodiment of the present invention, it is possible to precisely teach a transfer position of a substrate utilizing contact between a teaching substrate and a detection member. By using a teaching substrate and a detection member, it is possible to teach a hand in an existing substrate processing apparatus a transfer position of substrates.

Preferably, the substrate transfer member is a substrate-storing container for storing a plurality of substrates in a stacked condition.

Preferably, the teaching substrate and the detection member have electrical conductivity and the contact between the teaching substrate and the detection member is detected by a passage of electrical current between a teaching substrate and a detection member. With this, by utilizing a passage of electrical current between the teaching substrate and the detection member, it is possible to easily detect contacts between a teaching substrate and a detection member with ease while having a simple constitution.

Preferably, the detection member includes a pair of Y-direction contact member placed correspondingly to a width of an opening of the substrate-storing container and a pair of X-direction contact member placed correspondingly to a depth of an opening of the substrate-storing container. With this, it is possible to precisely teach transfer positions of substrates in X-direction and Y-direction by utilizing a pair of Y-direction contact member and a pair of X-direction contact member.

Preferably, each of the Y-direction contact member and the X-direction member has a shape of a column extending vertically, wherein each of the Y-direction contact member and the X-direction has flanges for supporting the teaching substrate at height positions respectively corresponding to a substrate-storing position at an uppermost part of the substrate-storing container and a substrate-storing position at a lowermost part of the substrate-storing container. With this, it is possible to precisely transfer a substrate to every storing positions of the substrate-storing container for storing substrates in a stacked condition by teaching transfer positions of the substrate at an uppermost part and a lowermost part of the substrate-storing container.

Preferably, the teaching substrate has a hole part into which the detection member is insertable. By utilizing the hole part, it is possible to teach a transfer position of a substrate in a X-direction and a Y-direction while achieving simple constitution.

A substrate processing apparatus connected with the transfer position teaching apparatus according to one of the preferred embodiments, preferably comprises: a controller part for controlling a position of a transfer robot having the hand; and a transfer position identification unit for identifying and storing the transfer position of the substrate based on the contact position of contact between the teaching substrate and the detection member.

DETAILED DESCRIPTION OF THE PREFERRED EMBODIMENTS

Figure 1:
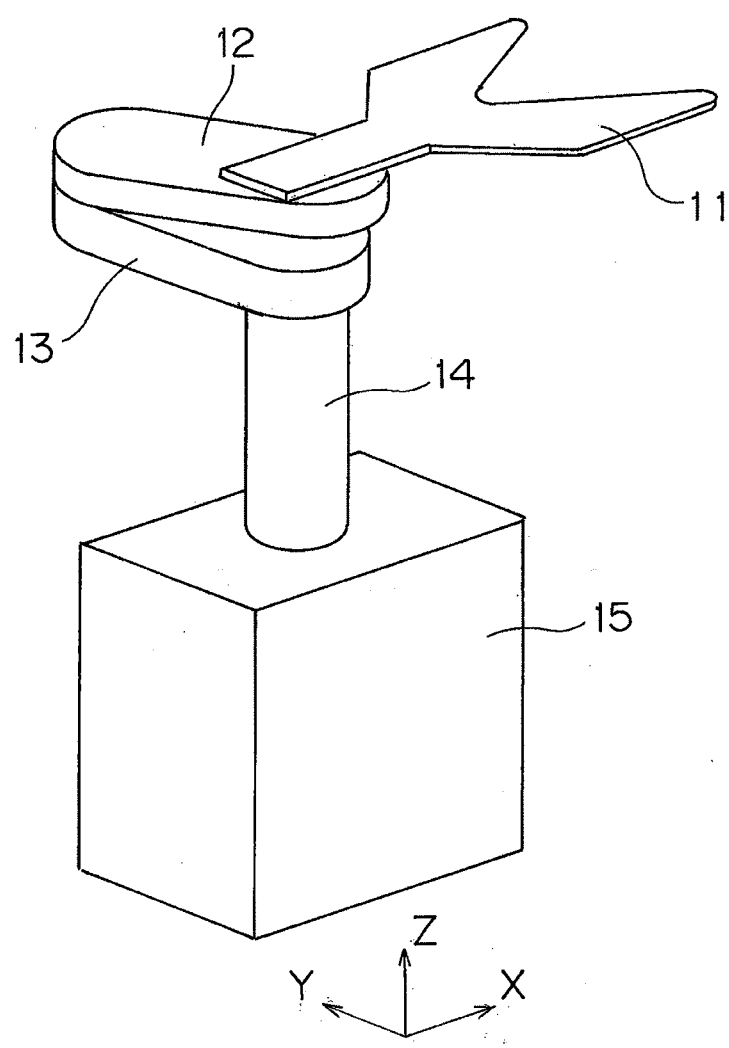
FIG. 1 is a schematic perspective view showing a transfer robot of a substrate processing apparatus provided with a hand, to which teaching of transfer positions is made by a transfer position teaching method or apparatus according to embodiments of the present invention.

Detailed description of the preferred embodiments of the present invention will be made hereinbelow, referring attached figures. First, constitution of a transfer robot provided with a hand 11 will be explained. FIG. 1 is a schematic perspective view showing a transfer robot of a substrate processing apparatus provided with a hand, for which teaching of transfer positions is made by a transfer position teaching method or a transfer position teaching apparatus according to embodiments of the present invention.

The transfer robot comprises a pedestal 15 having a spindle 14, a first arm 13 rotating relative to the spindle 14 about an axis in the Z-direction, a second arm 12 rotating relative to the first arm 13 about an axis in the Z-direction and a hand 11 rotating relative to the second arm 12 about an axis in the Z-direction. Because the transfer robot has a three-axis configuration described above, it is possible to move the hand 11 toward arbitrary direction in the X-Y plane. Further, the pedestal 15 has a up/down drive mechanism for moving up/down the hand by moving the spindle 14 in the Z-direction.

Figure 2:
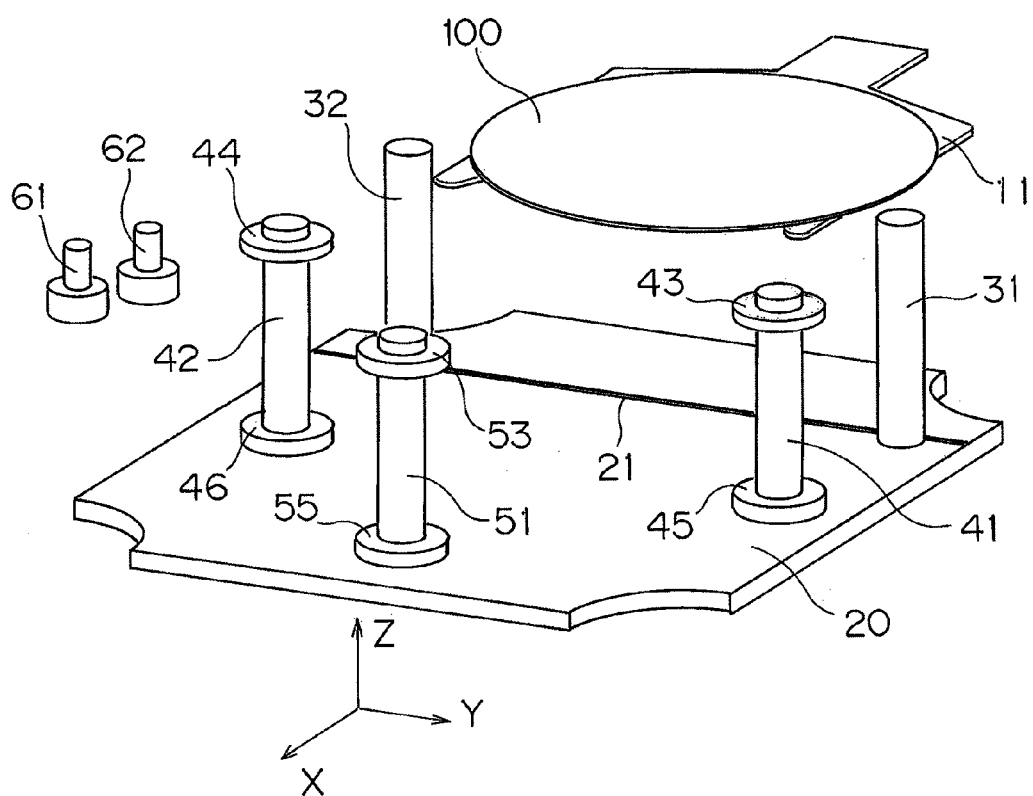
FIG. 2 is a schematic perspective view showing a main part of a transfer position teaching apparatus according to a first preferred embodiment of the present invention.

FIG. 2 is a schematic perspective view showing a main part of a transfer position teaching apparatus according to a first preferred embodiment of the present invention.

A transfer position teaching apparatus according to the first preferred embodiment of the present invention comprises a teaching substrate 100. The teaching substrate 100 has a shape identical to a substrate such as semiconductor wafers for processing by substrate processing apparatuses. The surface of the teaching substrate 100 is coated with an electrically conductive coating. Additionally, a substrate composed of an electrically conductive material may be used as the teaching substrate 100.

The transfer position teaching apparatus according to the first embodiment of the present invention also comprises a base member 20, on the upper face of which a reference line 21 is formed, on the surface of which an insulation coating is applied. On the base member 20, entrance contact members 31 and 32, Y-direction contact members 41 and 42 and a X-direction contact member 51 are vertically arranged, each having a pillar shape vertically extending (in the Z-direction shown in FIG. 2).

The Y-direction contact member 41 comprises a pair of flanges 43 and 45. The Y-direction contact member 42 comprises a pair of flanges 44 and 46. The X-direction contact member 51 comprises a pair of flanges 53 and 55. The upper faces of the flanges 43, 44 and 53 are arranged at height positions having the same height from the base member 20. The height positions of the flanges 43, 44 and 53 correspond to a height position of the uppermost storing position of a substrate in the substrate-storing container. The upper faces of the flanges 45, 46 and 55 are also arranged at positions having the same height from the base member 20. The height positions of the flanges 45, 46 and 55 correspond to a height position of the lowermost storing position of a substrate in the substrate-storing container.

Additionally, the pair of Y-direction contact members 41 and 42 are also arranged at positions corresponding to the width of an opening part of the substrate-storing container, into which substrates are to be stored. Also, the X-direction contact member 51 is arranged at a position corresponding to the depth of an opening part of the substrate-storing container, into which substrates are to be stored.

Each of the entrance contact members 31 and 32, the Y-direction contact members 41 and 42 and the X-direction contact member 51 is composed of an electrically conductive material. Also, the transfer position teaching apparatus according to the first embodiment of the present invention comprises a pair of abutment members 61 and 62 for correcting inclination of the hand 11 in θ-direction.

The transfer position teaching apparatus is an apparatus for teaching the hand 11 a transfer position, the hand 11 being as a substrate transfer member for transferring substrates to the substrate-storing container according to the invention. The substrate-storing container is a container for storing a plurality of substrates in a stacked condition. More specifically, it is a FOUP of a hermetically closed-type storing pod for semiconductor wafers in conformity with SEMI (Semiconductor Equipment and Materials Institute) standards. Using a kinematic pin, the base member 20 is positioned and fixed to a load port in the substrate processing apparatus.

A target jig is configured by the base member 20, the entrance contact members 31 and 32, the Y-direction contact members 41 and 42, the X-direction contact member 51.

Figure 3:
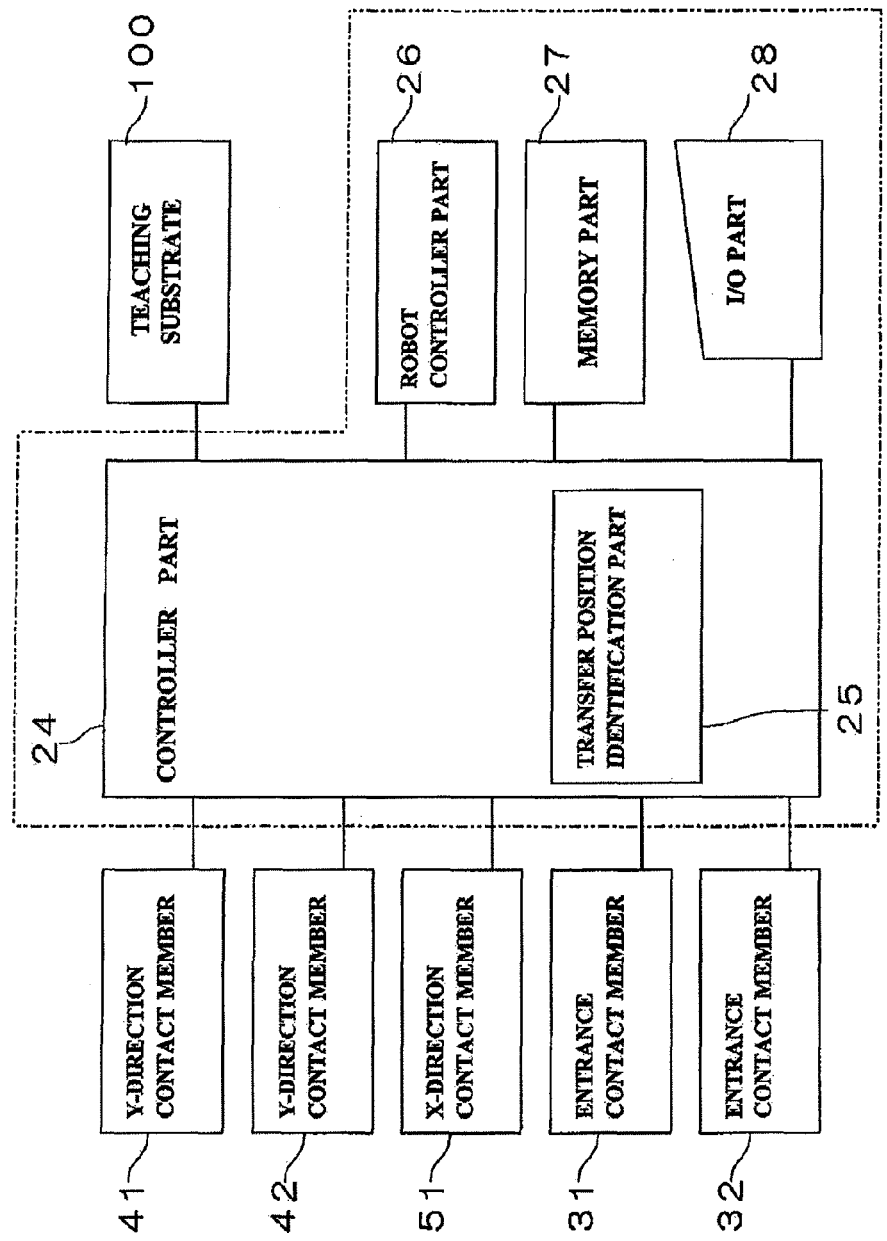
FIG. 3 is a block diagram showing a control system of a transfer position teaching apparatus according to the preferred embodiments of the present invention.

FIG. 3 is a block diagram showing a control system of a transfer position teaching apparatus according to embodiments of the present invention.

The transfer position teaching apparatus comprises a controller part 24 for controlling the whole apparatus. The controller part 24 realizes various functions to be described later through RAM and ROM as memory devices and CPU as arithmetic device. The controller part 24 includes a transfer position determination part 25 for executing a transfer position identification action to be later described for identifying and storing a transfer position of a substrate. Also, the controller part 24 is connected with the above described entrance contact members 31 and 32, the Y-direction contact members 41 and 42, X-direction contact member 51 and the teaching substrate 100. Also, the controller part 24 controls the driving of a transfer robot shown in FIG. 1 and is connected with a robot controller part 26 for recognizing a position of the hand 11. Further, the controller part 24 is also connected with a memory part 27 for storing various parameters or the like which is to be described later and an I/O part for conducting input/output of data or the like.

Also, the transfer position teaching apparatus may be configured by connecting with a substrate processing apparatus provided with a transfer robot. Specifically, the controller part 24, the robot controller part 26, the memory part 27 and I/O part 28 encircled by alternate long and two short dashes lines in FIG. 3 are configured in the side of the substrate processing apparatus. It is possible to configure the transfer position teaching apparatus shown in FIG. 3 by electrically connecting the Y-direction contact members 41 and 42, the X-direction contact member 51, entrance contact members 31 and 32 and the teaching substrate 100 to the controller part 24 of the substrate processing apparatus.

Figure 4:
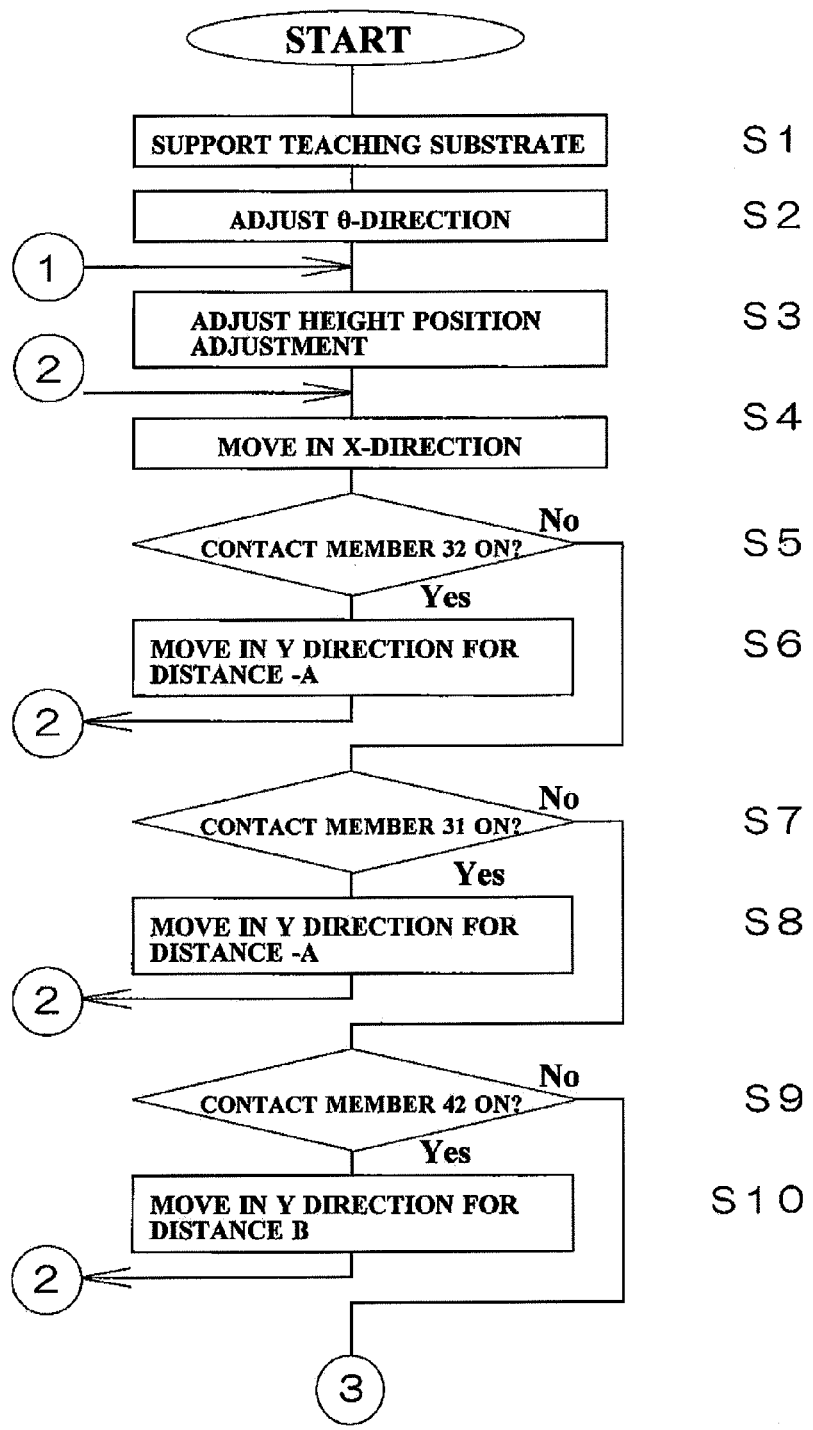
FIG. 4 is a flowchart showing a transfer position teaching method according to the preferred embodiments of the present invention.
Figure 5:
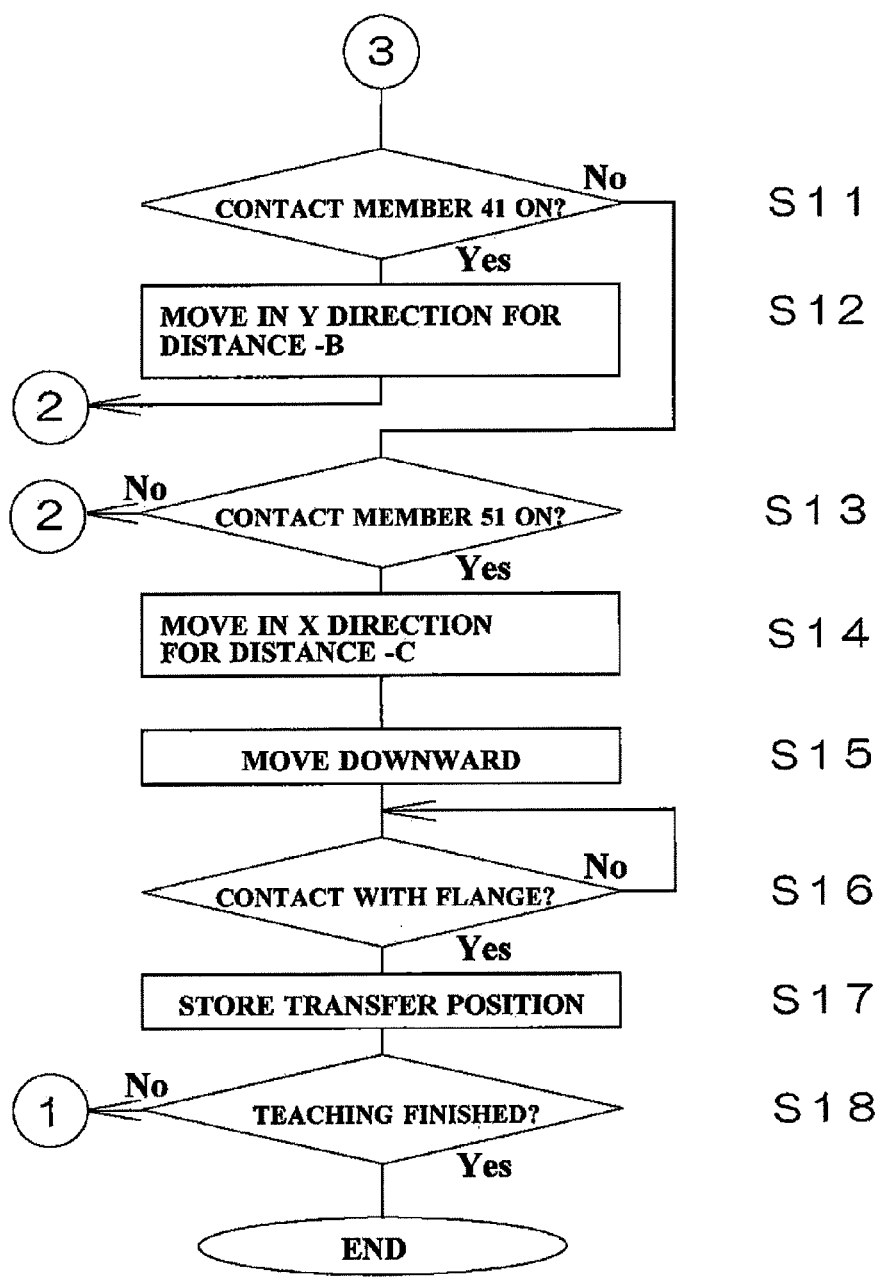
FIG. 5 is a flowchart showing a transfer position teaching method according to the preferred embodiments of the present invention.
Figure 6:
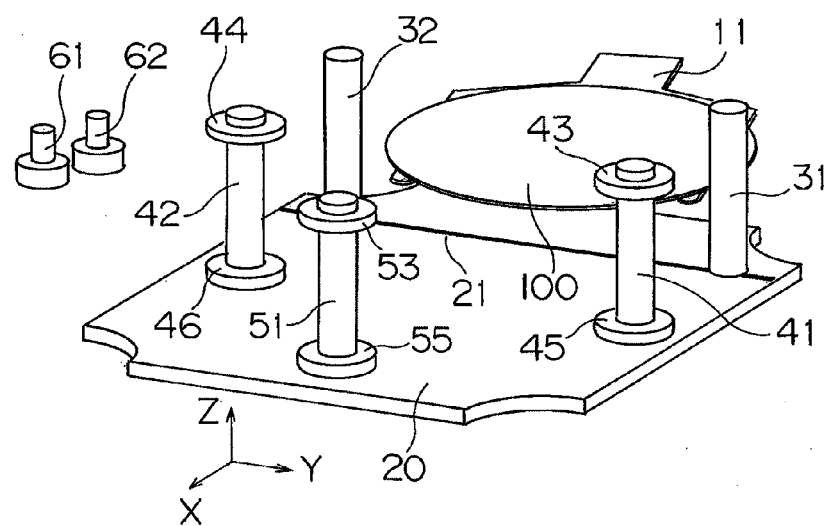
FIG. 6A is an explanatory drawing showing actions in teaching transfer positions with a transfer position teaching apparatus according to the first preferred embodiment of the present invention.
FIG. 6B is an explanatory drawing showing actions in teaching transfer positions with a transfer position teaching apparatus according to the first preferred embodiment of the present invention.
Figure 6:
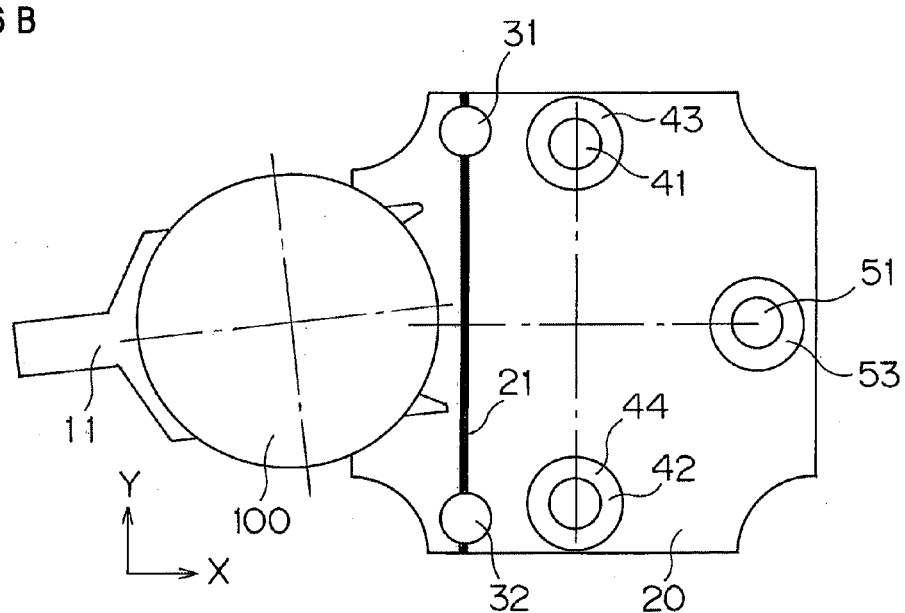
Figure 7:
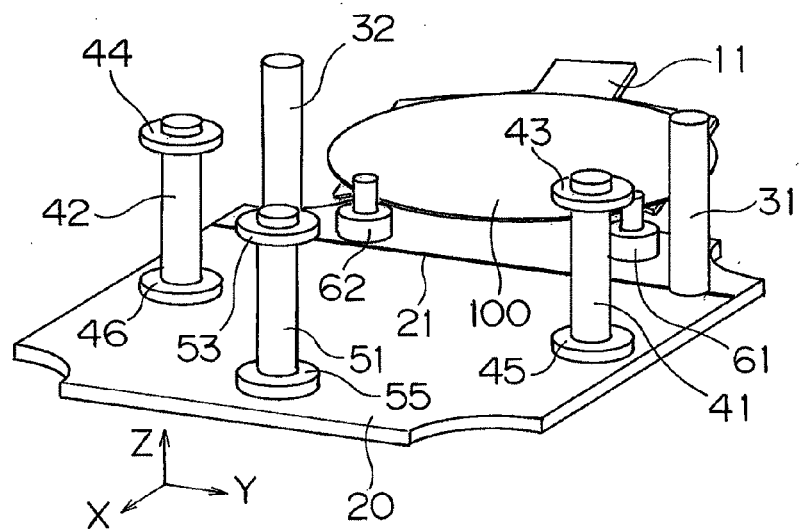
FIG. 7A is an explanatory drawing showing actions in teaching transfer positions with a transfer position teaching apparatus according to the first preferred embodiment of the present invention.
FIG. 7B is an explanatory drawing showing actions in teaching transfer positions with a transfer position teaching apparatus according to the first preferred embodiment of the present invention.
Figure 7:
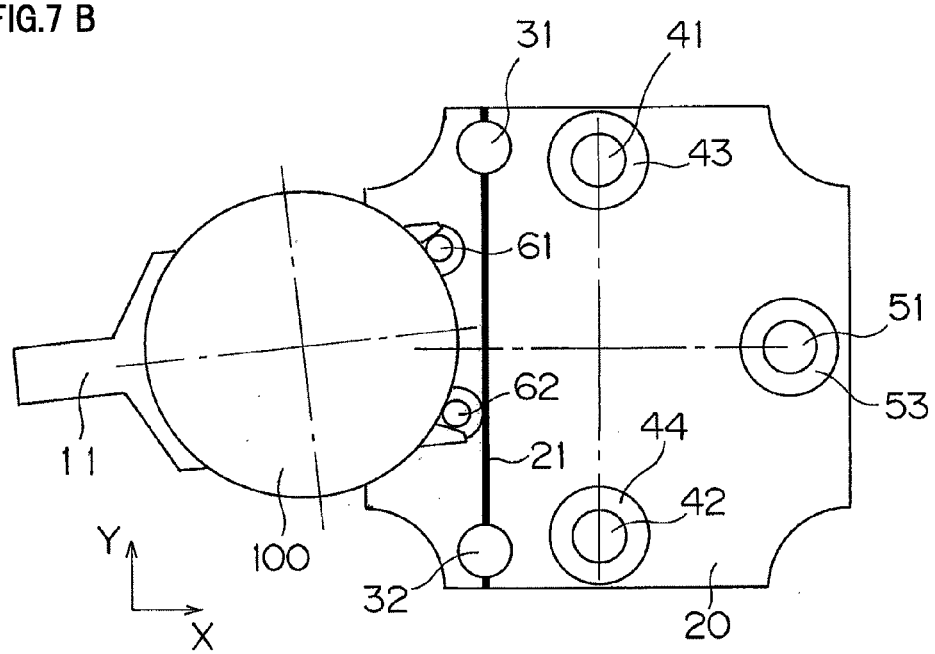
Figure 8:
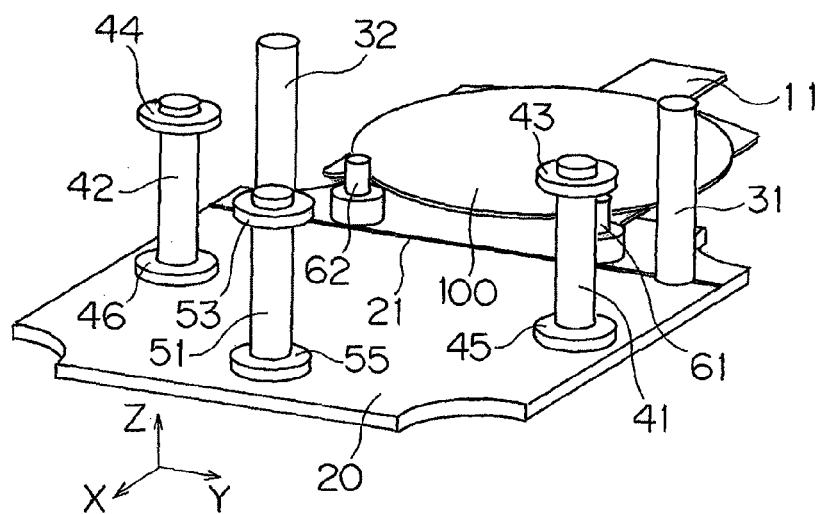
FIG. 8A is an explanatory drawing showing actions in teaching transfer positions with a transfer position teaching apparatus according to the first preferred embodiment of the present invention.
FIG. 8B is an explanatory drawing showing actions in teaching transfer positions with a transfer position teaching apparatus according to the first preferred embodiment of the present invention.
Figure 8:
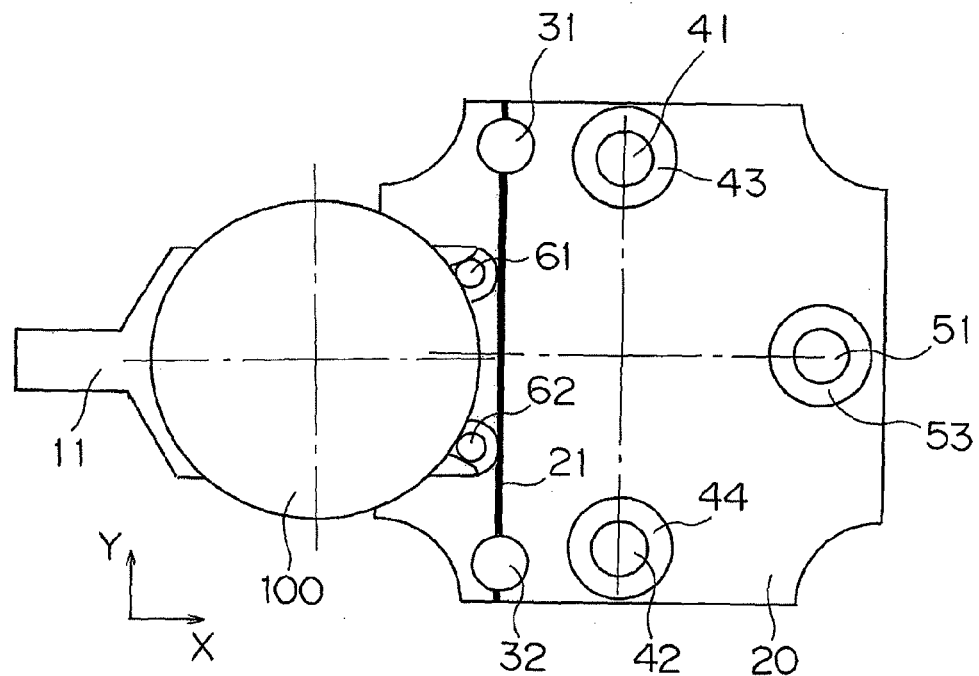

Next, a transfer position teaching method using the above described transfer position teaching apparatus will be described. FIG. 4 and FIG. 5 are flowcharts showing a transfer position teaching method according to the preferred embodiment of the present invention. FIG. 6A to FIG. 14B are explanatory drawings showing actions in teaching transfer positions with a transfer position teaching apparatus according to the first preferred embodiment of the present invention. FIGS. 6A, 7A, 8A, 9A, 10A, 11A, 12A, 13A and 14A are perspective views. FIGS. 6B, 7B, 8B, 9B, 10B, 11B, 12B, 13B and 14B are plan views. In FIGS. 10B, 11B, 12B and 13B, for the purpose of illustration, flanges 43, 44, 53 are omitted.

First, a teaching substrate 100 is supported by the hand 11 as shown in FIG. 6A and FIG. 6B when executing actions in teaching transfer positions (STEP S1). In this condition, the moving direction of the hand 11 (the direction to which the hand moves as a result of the movements of the rotations of the arm 13, the arm 14 and the hand 11) supporting the teaching substrate 100 does not strictly match with the direction (the direction along from the middle part of the FOUP to the opening of the FOUP: in other words, the direction from the X-direction contact member 51 to the middle position between the entrance contact member 31 and 32) of the target jig (configured with the base member 20, the entrance contact members 31 and 32, the Y-direction contact members 51 and 42 and the X-direction contact member 51). For this reason, adjustments in θ direction are made so that the moving direction of the hand 11 crosses perpendicularly with the opening of the FOUP (STEP S2)

In this case, as shown in FIG. 7A and FIG. 7B, a pair of abutment members 61 and 62 is placed so as to abut with both the hand 11 and the teaching substrate 100. In this condition, the hand 11 is moved, specifically by changing the angles of the arm 13, the arm 14 and the hand 11 or moving positions of the pedestal 15. Then the hand 11 is halted at a position at which an edge part of the pair of abutment members 61 and 62 matches the reference line 21 formed on the base member 20, as shown in FIG. 8A and FIG. 8B, thereby matching the directions of the hand 11 and the target jig.

In cases when the direction of the hand 11 already matches the direction of the target jig, namely the direction of the hand entering into the substrate-storing container matches with the direction of the opening of the substrate-storing container, above described adjustments in θ direction may be skipped.

Figure 9A:
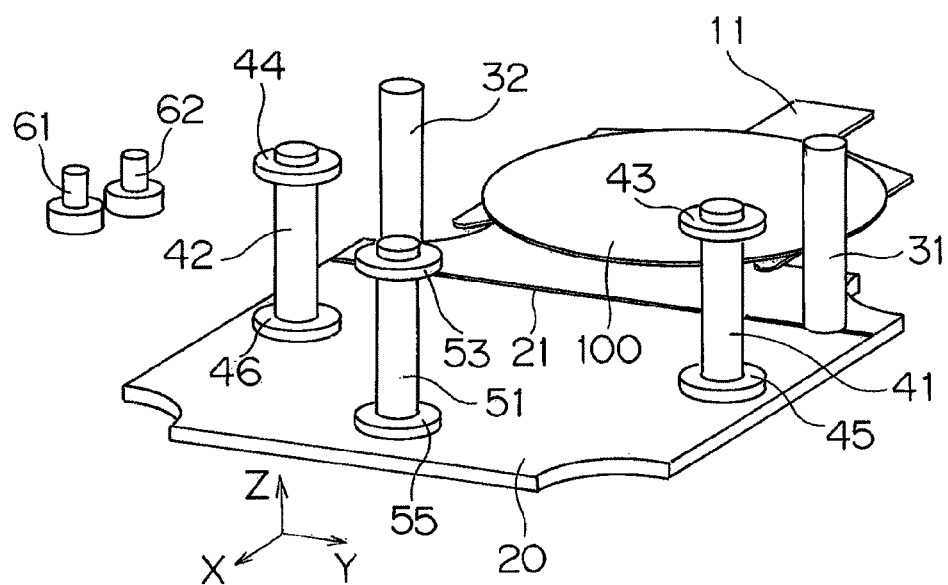
FIG. 9A is an explanatory drawing showing actions in teaching transfer positions with a transfer position teaching apparatus according to the first preferred embodiment of the present invention.
Figure 9B:
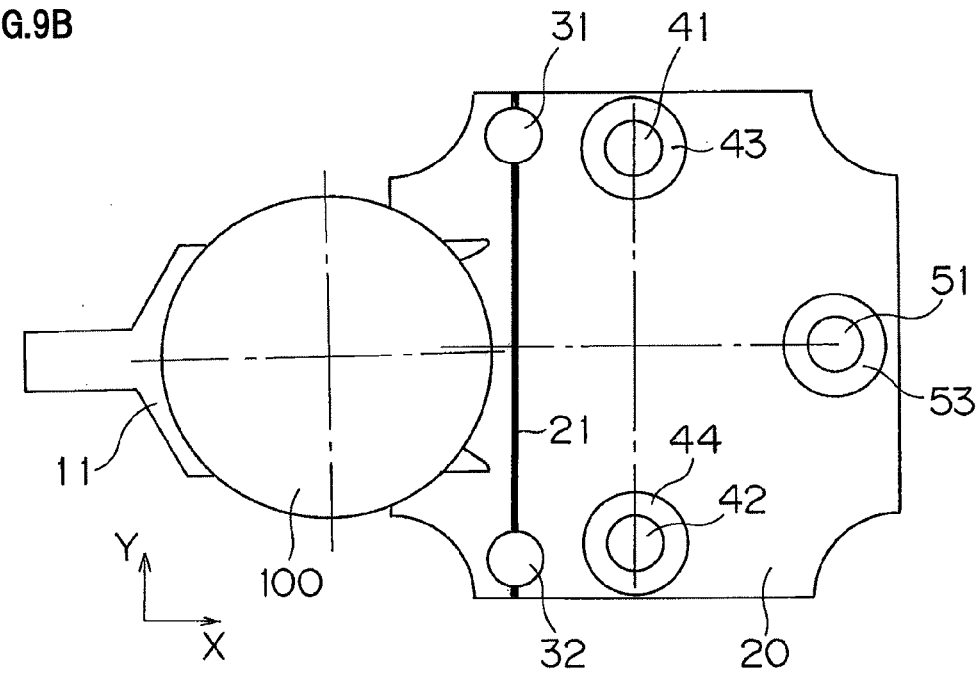
FIG. 9B is an explanatory drawing showing actions in teaching transfer positions with a transfer position teaching apparatus according to the first preferred embodiment of the present invention.
Figure 10:
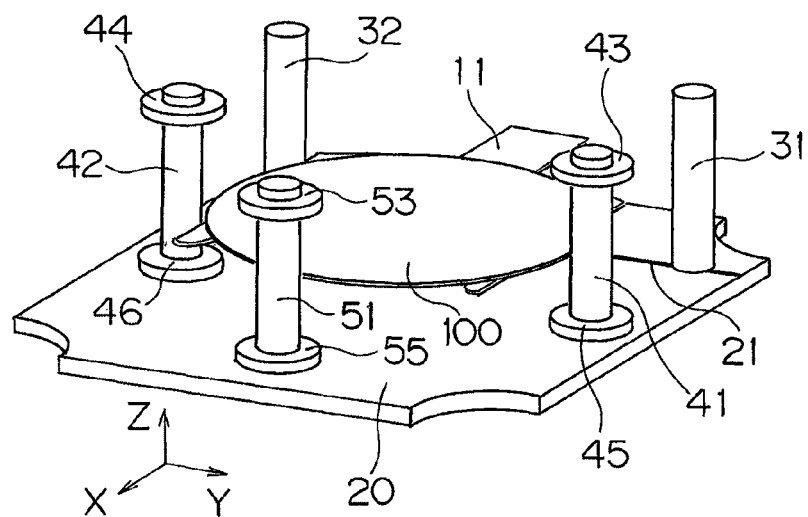
FIG. 10A is an explanatory drawing showing actions in teaching transfer positions with a transfer position teaching apparatus according to the first preferred embodiment of the present invention.
FIG. 10B is an explanatory drawing showing actions in teaching transfer positions with a transfer position teaching apparatus according to the first preferred embodiment of the present invention.
Figure 10:
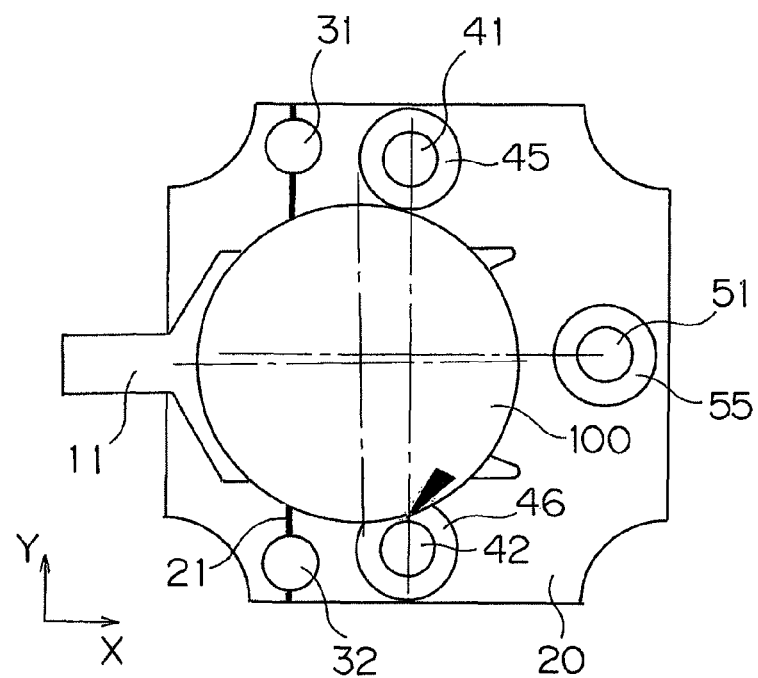
Figure 11:
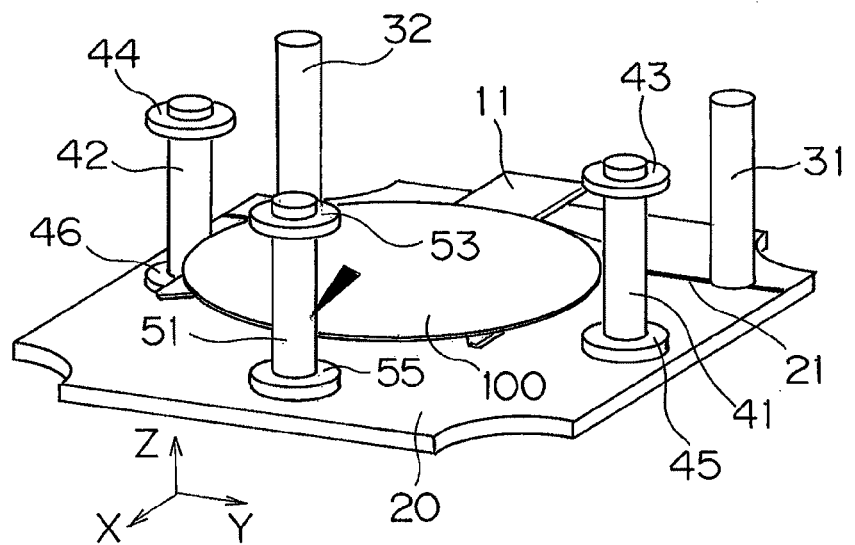
FIG. 11A is an explanatory drawing showing actions in teaching transfer positions with a transfer position teaching apparatus according to the first preferred embodiment of the present invention.
FIG. 11B is an explanatory drawing showing actions in teaching transfer positions with a transfer position teaching apparatus according to the first preferred embodiment of the present invention.
Figure 11:
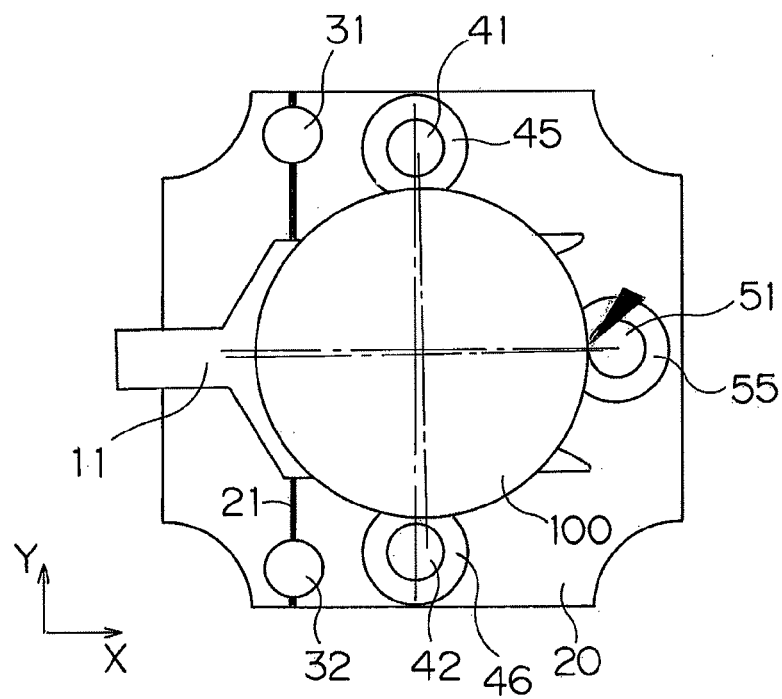
Figure 12:
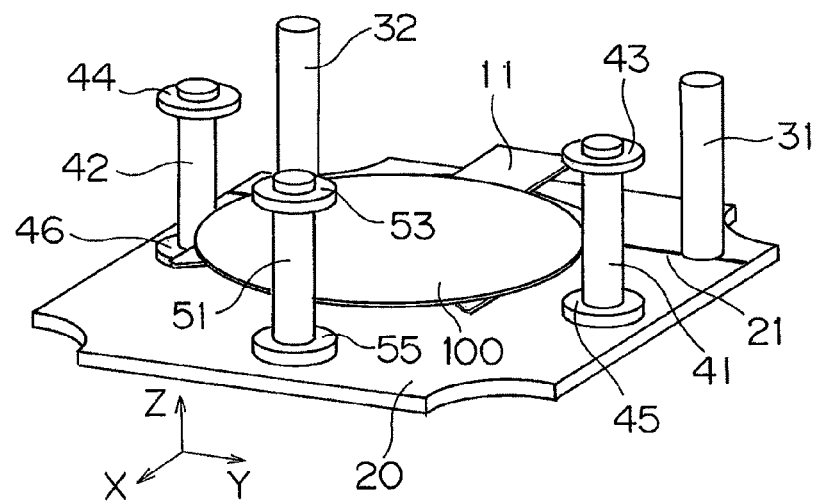
FIG. 12A is an explanatory drawing showing actions in teaching transfer positions with a transfer position teaching apparatus according to the first preferred embodiment of the present invention.
FIG. 12B is an explanatory drawing showing actions in teaching transfer positions with a transfer position teaching apparatus according to the first preferred embodiment of the present invention.
Figure 12:
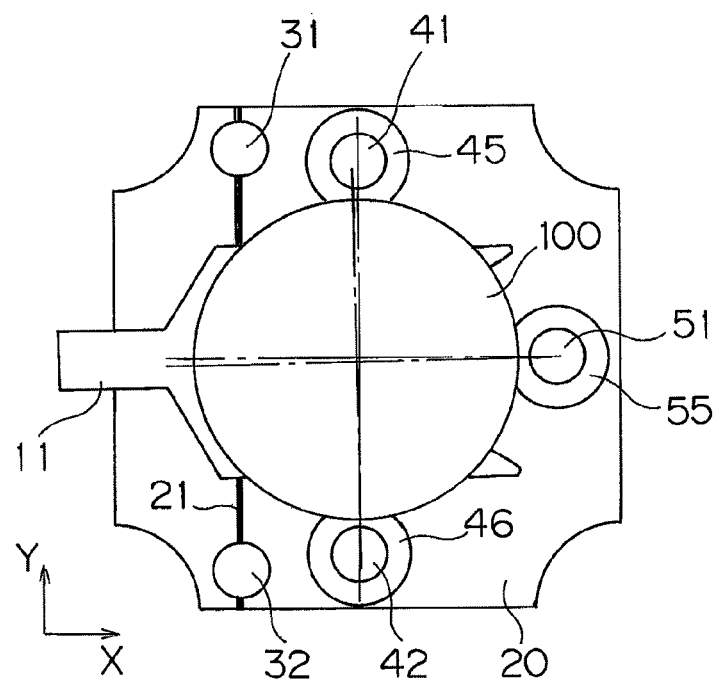
Figure 13:
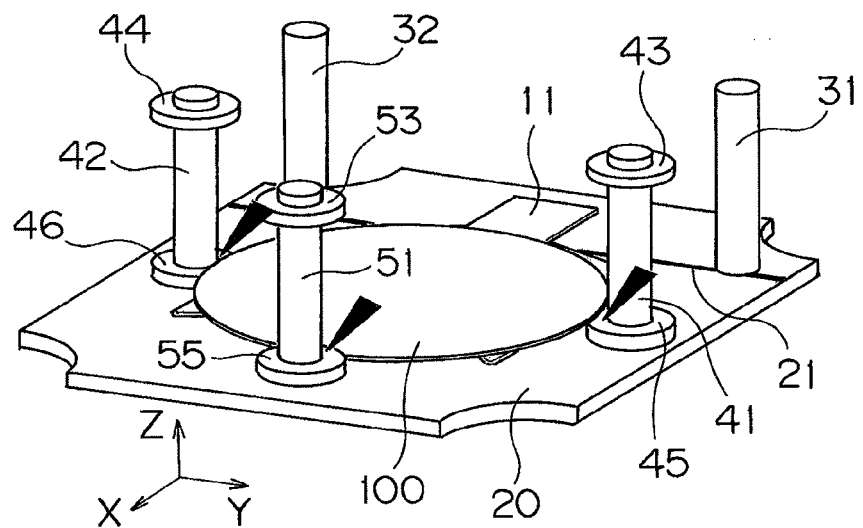
FIG. 13A is an explanatory drawing showing actions in teaching transfer positions with a transfer position teaching apparatus according to the first preferred embodiment of the present invention.
FIG. 13B is an explanatory drawing showing actions in teaching transfer positions with a transfer position teaching apparatus according to the first preferred embodiment of the present invention.
Figure 13:
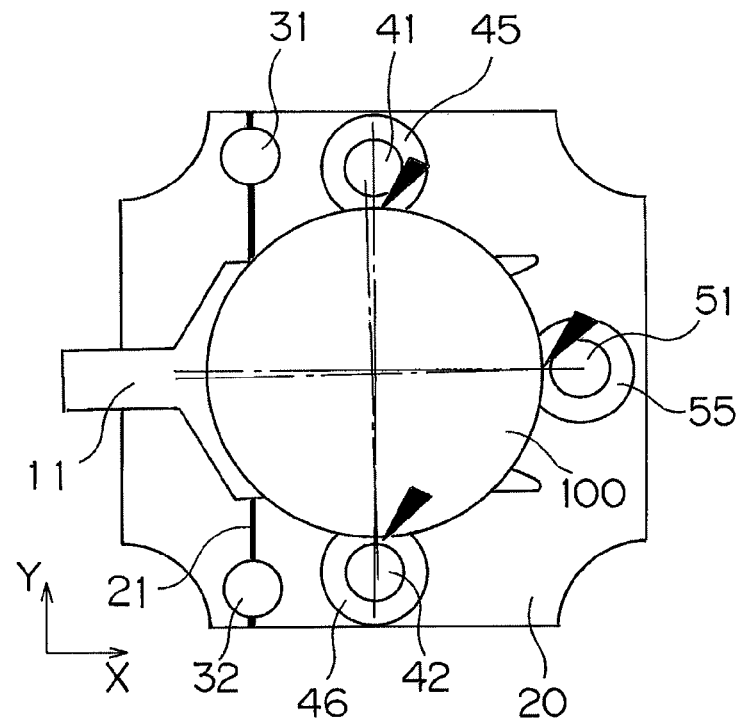
Figure 14:
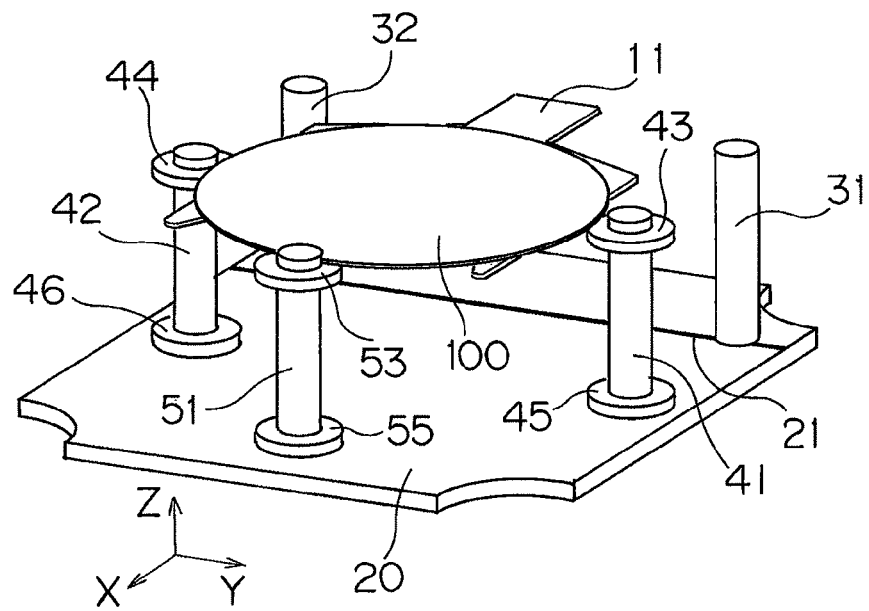
FIG. 14A is an explanatory drawing showing actions in teaching transfer positions with a transfer position teaching apparatus according to the first preferred embodiment of the present invention.
FIG. 14B is an explanatory drawing showing actions in teaching transfer positions with a transfer position teaching apparatus according to the first preferred embodiment of the present invention.
Figure 14:
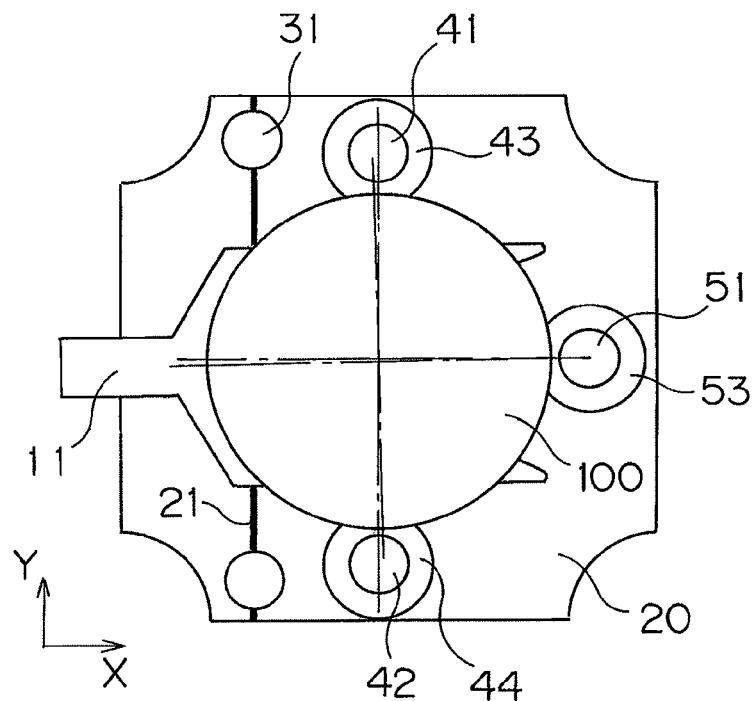

Next, as shown in FIG. 9A and FIG. 9B, a pair of the abutment members 61 and 62 is cleared off from the base member 20. Then the position of the hand 11 is adjusted in height so that the teaching substrate 100 supported by the hand 11 is placed between: the flange 43 of the Y-direction contact member 41, the flange 44 of the Y-direction contact member 42 and the flange 53 of the X-direction contact member 51; and the flange 45 of the Y-direction contact member 41, the flange 46 of the Y-direction contact member 42 and the flange 55 of the X-direction contact member 51 (STEP S3).

In this condition, the hand 11 is moved in X-direction shown in FIGS. 9A and 9B, along with the teaching substrate 100 (STEP S4).

First, checking is conducted whether either of the entrance contact member 31 or the entrance contact member 32 is "ON" while moving the hand 11 in X-direction: "ON" being a passage of electrical current between the teaching substrate 100 and either of the entrance contact member 31 or the entrance contact member 32 as a result of contact between the teaching substrate 100 and either of the entrance contact member 31 or the entrance contact member 32, each entrance contact member having electrical conductivity (STEP S5, STEP S7). It is considered that as long as contact between the teaching substrate 100 and either of the entrance contact member 31 or the entrance contact member 32 occurs, contact between a substrate and the entrance part of the substrate-storing container upon storing the substrate into the substrate-storing container by the hand 11 will occur under the same condition. For this reason, when the entrance contact member 32 is "ON" (STEP S5) by contact between the teaching substrate 100 and the entrance contact member 32, the hand 11 is moved in Y-direction shown in FIGS. 9A and 9B for distance A (STEP S6). On the other hand, when the entrance contact member 31 is "ON" (STEP S7) by contact between the teaching substrate 100 and the entrance contact member 31, the hand 11 is moved in Y-direction shown in Y-direction shown in FIGS. 9A and 9B for distance −A (that is, in minus Y-direction for distance A) (STEP S8).

When the hand 11 is moved further in X-direction, checking is made whether either of the Y-direction contact member 41 or the Y-direction contact member 42 is "ON" by a passage of electrical current between the teaching substrate 100 and either of the Y-direction contact member 41 or the Y-direction contact member 42 as a result of contact between the teaching substrate 100 and either of the Y-direction contact member 41 or the Y-direction contact member 42, each having electrical conductivity (STEP S9, STEP S11). It is considered that as long as contact between the teaching substrate 100 and either of the Y-direction contact member 41 or the Y-direction contact member 42 occurs, contact between a substrate and the side wall of the substrate-storing container upon storing the substrate into the substrate-storing container by the hand 11 will occur under the same condition. For this reason, when the Y-direction contact member 42 is "ON" (STEP S9) by contact between the teaching substrate 100 and the Y-direction contact member 42, the hand 11 is moved in Y-direction shown in FIGS. 9A and 9B for distance B (STEP S10). On the other hand, when the entrance contact member 31 is "ON" (STEP S7) by contact between the teaching substrate 100 and the entrance contact member 31, the hand 11 is moved in Y-direction shown in FIGS. 9A and 9B for distance −A (or in minus Y-direction for distance A) (STEP S6).

FIGS. 10A and 10B show a condition that the teaching substrate 100 supported by the hand 11 abuts with the Y-direction contact member 42 in above-described STEP S5 to S12. In a condition shown in FIGS. 10A and 10B, the hand 11 is moved in Y-direction for distance B.

Movement of the hand 11 in X-direction still continues after finishing positioning of the hand 11 in Y-direction by above-described actions. As shown in FIGS. 11A and 11B, checking is made whether X-direction contact member 51 is "ON" by a passage of electrical current between the teaching substrate 100 and the X-direction contact member 51 as a result of contact between the teaching substrate 100 and the X-direction contact member 51, each having electrical conductivity (STEP S13). It is considered that as long as contact between the teaching substrate 100 and the X-direction contact member 51, contact between a substrate and the wall part on the back side of the substrate-storing container upon storing the substrate into the substrate-storing container by the hand 11 will occur under the same condition. For this reason, when the X-direction contact member 51 is "ON" (STEP S13) by contact between the teaching substrate 100 and the X-direction contact member 51, the hand 11 is moved in X-direction shown in FIGS. 11A and 11B for distance C (STEP S14). With this, as shown in FIGS. 12A and 12B, the positioning of the hand 11 both in Y-direction and X-direction is completed.

Additionally, above-described distances A, B and C are parameters having been specified taking account of tolerances in conformity with SEMI standards, for example. About 5 mm for a distance A, about 2 mm for a distance B and about 1 mm for a distance C are set. These distances A, B and C are set based on SEMI standards and the like and are stored in advance in the memory part 27 as shown in FIG. 3.

As shown in FIGS. 12A and 12B, after completing the positioning of the hand 11 in Y-direction and X-direction, the hand 11 is moved downward, or in Z-direction as shown in FIGS. 12A and 12B, along with the teaching substrate 100. Thereafter, when the teaching substrate 100 contacts the flange 45, 46 or 55 (STEP S16), the downward movement of the hand 11 is halted at the height position as shown in FIGS. 13A and 13B. And then positional data of the hand 11 at the moment is collected from the robot controller part 26 shown in FIG. 3 to identify the position of the hand 11 at the moment, by the means of a transfer position identification part 25 in the controller part 24 shown in FIG. 3 as a transfer position of a substrate when transferring the substrate to the lowermost storing position of the substrate-storing container, while storing the position of the hand 11 at the moment in the memory part 27 (STEP S17).

Additionally, in a case that the principal face of the teaching substrate 100 supported by the hand 11 faces is set horizontally, because the upper faces of the flanges 45, 46 and 55 are set at positions equal in height, it is assumed that the teaching substrate 100 would make contact with all of the flanges 45, 46 and 55 simultaneously. Consequently, when heights of positions at which the teaching substrate 100 and the flanges 45, 46 or 55 make contact are different more than a given value, it is possible to determine an occurrence of yawing of the hand 11.

By finishing the above steps, actions in teaching transfer positions of the substrate to the lowermost storing position in the substrate-storing container are finished. Actions are finished provided that all of the actions in teaching are completed. On the other hands, in a case that the actions in teaching transfer positions of the substrate to the uppermost storing position in the substrate-storing container is to be executed subsequently (STEP S18), processing step goes back to STEP S3.

Then the height position of the hand 11 is adjusted so that the teaching substrate 100 supported by the hand 11 is placed above the flange 43 of the Y-direction contact member 41, the flange 44 of the Y-direction contact member 42 and the flange 53 of the X-direction contact member 51. Then as shown in FIGS. 14A and 14B, STEP 4 to STEP 15 are executed in likewise actions described hereinabove. Because the positioning of the hand 11 in horizontal direction is already completed at this time, it is assumed that STEP S5, S7, S9, and S11 are determined to be "NO." Then the hand 11 is halted at a position before the X-direction contact member 51 is "ON" (corresponding to a position the hand 11 is moved in X-direction for distance –C in STEP S14), then is moved downward subsequently.

The hand 11 in a state shown in FIGS. 14A and 14B is moved downward, or in –Z direction as shown in FIGS. 12A and 12B, along with the teaching substrate 100. When the teaching substrate 100 makes contact with the flange 43, 44 or 53, the downward movement of the hand 11 is halted at the height position (STEP S16). And then positional data of the hand 11 at the moment is collected from the robot controller part 26 shown in FIG. 3 to identify the position of the hand 11 at the moment by the means of a transfer position identification part in the controller part 24 shown in FIG. 3 as a transfer position of a substrate when transferring the substrate to the lowermost storing position of the substrate-storing container, while storing the position of the hand 11 at the moment in the memory part 27 (STEP S17). As a result of this, actions in teaching transfer positions of a substrate when transferring the substrate to the lowermost and the uppermost storing positions in the substrate-storing container are finished.

Additionally, the steps described above may be executed automatically according to a program programmed in advance or may be executed manually by an operator.

Figure 15:
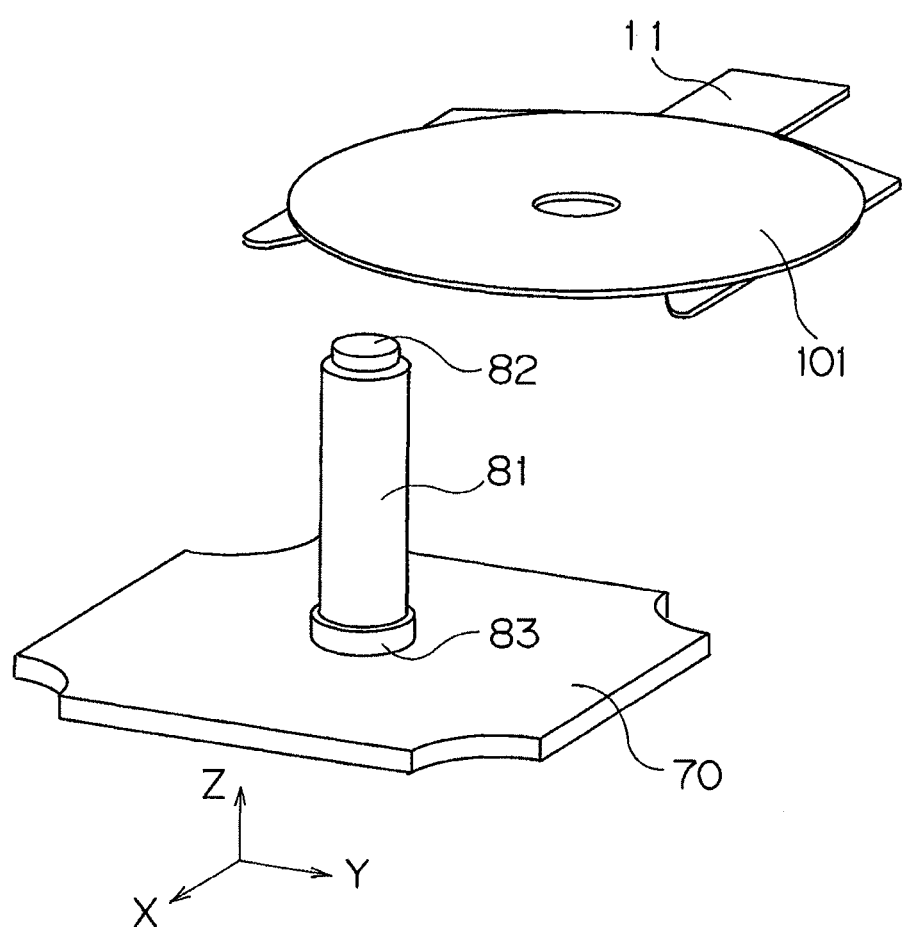
FIG. 15 is a schematic perspective view showing a main part of a transfer position teaching apparatus according to a second preferred embodiment of the present invention.
Figure 16:
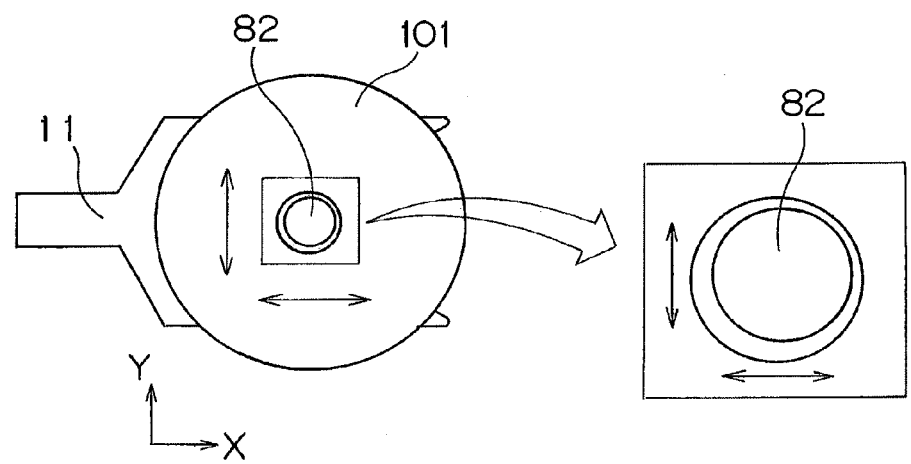
FIG. 16A is an explanatory drawing showing actions in teaching transfer positions with a transfer position teaching apparatus according to the second preferred embodiment of the present invention.
FIG. 16B is an explanatory drawing showing actions in teaching transfer positions with a transfer position teaching apparatus according to the second preferred embodiment of the present invention.
Figure 16:
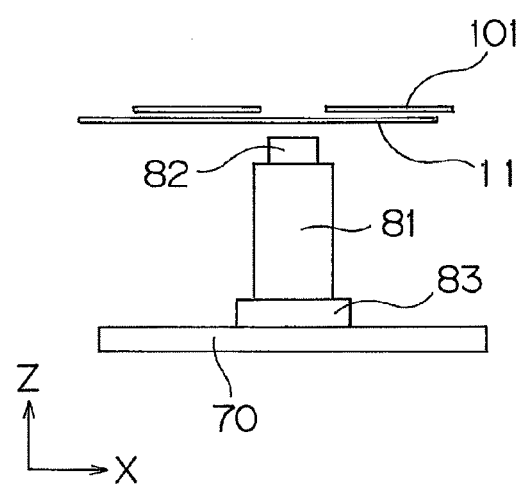
Figure 17:
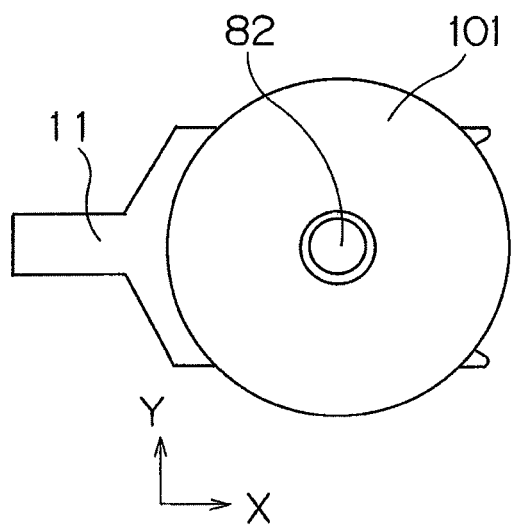
FIG. 17A is an explanatory drawing showing actions in teaching transfer positions with a transfer position teaching apparatus according to the second preferred embodiment of the present invention.
FIG. 17B is an explanatory drawing showing actions in teaching transfer positions with a transfer position teaching apparatus according to the second preferred embodiment of the present invention.
Figure 17:
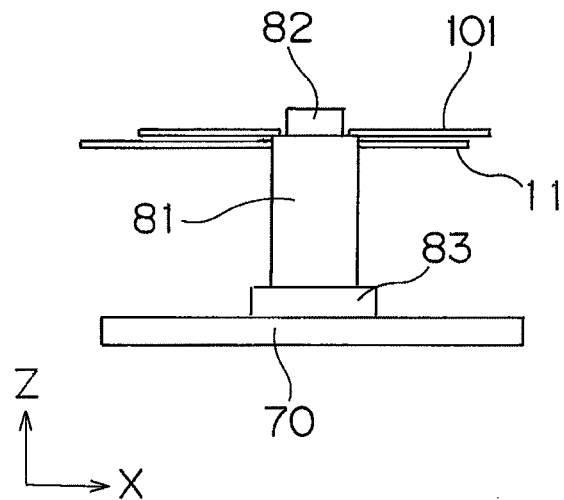

Next, another embodiment of a transfer position teaching apparatus according to the present invention will be described. FIG. 15 is a schematic perspective view showing the main part of a transfer position teaching apparatus according to the second embodiment of the present invention. FIG. 16A to FIG. 19B are explanatory diagrams showing actions in teaching transfer positions by the transfer position teaching apparatus according to the second embodiment of the present invention. Additionally, FIGS. 16A, 17A, 18A and 19A are plan views. FIGS. 16B, 17B, 18B and 19B are side views.

The transfer position teaching apparatus according to the second embodiment of the present invention comprises a pair of teaching substrates 101 and 102, each having a hole part formed thereon with distinct inner diameter. Each of the teaching substrate 101 and 102 has a shape identical to that of substrates such as semiconductor wafers processed by substrate processing apparatuses, and is coated with electrically conductive coating on the surface thereof. Additionally, as the teaching substrates 101 and 102, substrates composed of electrically conductive materials may be used.

Also, the transfer position teaching apparatus according to the second embodiment of the present invention has a base member 70 coated with insulation coating thereon. On the base member 70, a contact member 81 having a pillar shape, composed of electrically conductive material, vertically extending (Z-direction shown in FIG. 15), is vertically arranged. And a small-diameter part 82 having a small outer diameter is formed at the upper end of the contact member 81. A large-diameter part 83 having a large outer diameter is formed at the lower end of the contact member 81. The height position of the lower end of the small-diameter part 82, namely the height position of the upper face of the body part of the contact member 81 corresponds to that of the uppermost storing position in the substrate-storing container. Also, the height position of the upper face of the large-diameter part 83 corresponds to that of the lowermost storing position in the substrate-storing container.

Additionally, the base member 70 and the contact member 81 configure a target jig in the transfer position teaching apparatus according to the second embodiment of the present invention. In the transfer position teaching apparatus according to the second embodiment of the present invention, the target jig is placed on a place in a substrate-storing container of an existing substrate processing apparatus, so as to be executed actions in teaching transfer positions. Additionally, the only difference between the first and the second embodiments is the constitution of target jig.

When executing actions in teaching transfer positions on the transfer position teaching apparatus according to the second embodiment, to begin with, the teaching substrate 101 formed a hole part with small diameter thereon is supported by the hand 11 as shown in FIG. 15 and FIGS. 16A and 16B. Additionally, the inner diameter of the hole part formed on the teaching substrate 101 is slightly bigger than the outer diameter of the small-diameter part 82 of the contact member 81. The relationship between the inner diameter of the hole part formed on the teaching substrate 101 and the outer diameter of the small-diameter part 82 of the contact member 81 is specified taking account of tolerances in conformity with SEMI standards.

In this condition, the teaching substrate 101 is placed by moving the hand in X-direction and Y-direction shown in FIGS. 16A and 16B so that the inner wall of the hole part formed on the teaching substrate 101 is placed outside of the small-diameter part 82 of the contact member 81. As a result of this, as shown in FIGS. 16A and 16B, positioning of the hand 11 in Y-direction and X-direction are completed.

Next, upon completion of the positioning of the hand 11 in Y-direction and X-direction, the hand 11 is moved downward, or −Z direction, along with the teaching substrate 101 as shown in FIGS. 16A and 16B. Then as shown in FIGS. 17A and 17B, when contact is made between the teaching substrate 101 and the upper face of the main body part in the contact member 81, the upper face of the main body part being placed at a height position of the lower end of the small-diameter part 82 in the contact member 81, the downward movement of the hand 11 is halted at the height position. And then positional data of the hand 11 at the moment is collected from the robot controller part 26 by the controller part 24 shown in FIG. 3 to identify the position of the hand 11 at the moment by the means of a transfer position identification part 25 in the controller part 24 shown in FIG. 3 as a transfer position of a substrate when transferring the substrate to the uppermost storing position of the substrate-storing container, while storing the position of the hand 11 at the moment in the memory part 27.

Next, as shown in FIGS. 18A and 18B, the teaching substrate 102 having a large-diameter hole part formed thereon is supported by the hand 11. The inner diameter of the hole part formed on the teaching substrate 102 is slightly longer than the outer diameter of the main body part of the contact member 81. The relationship between the inner diameter of the hole part formed on the teaching substrate 102 and the outer diameter of the main body part of the contact member 81 is specified taking account of tolerances in conformity with SEMI standards, for example.

Figure 18:
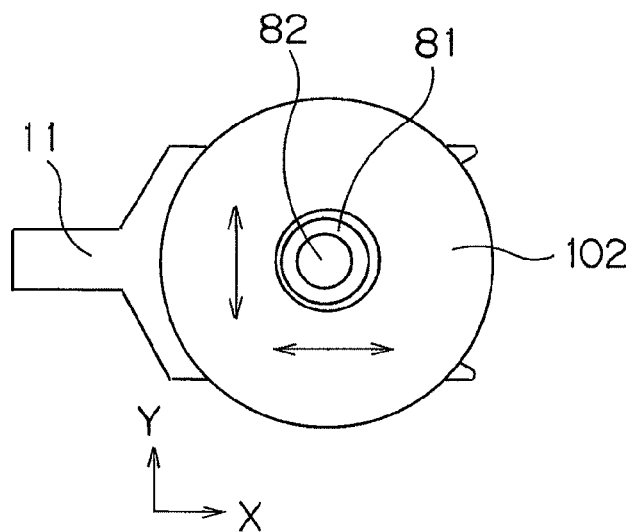
FIG. 18A is an explanatory drawing showing actions in teaching transfer positions with a transfer position teaching apparatus according to the second preferred embodiment of the present invention.
FIG. 18B is an explanatory drawing showing actions in teaching transfer positions with a transfer position teaching apparatus according to the second preferred embodiment of the present invention.
Figure 18:
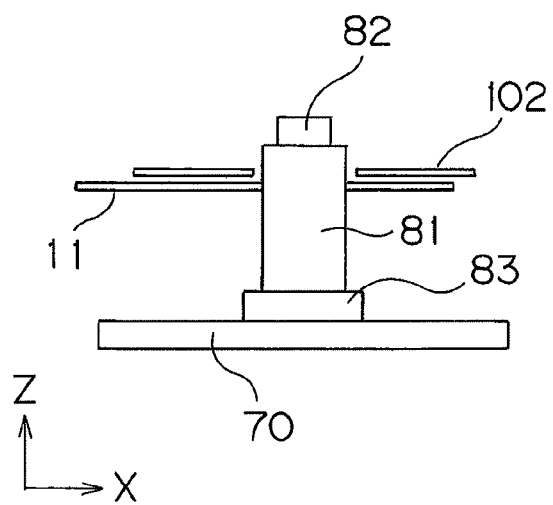
Figure 19:
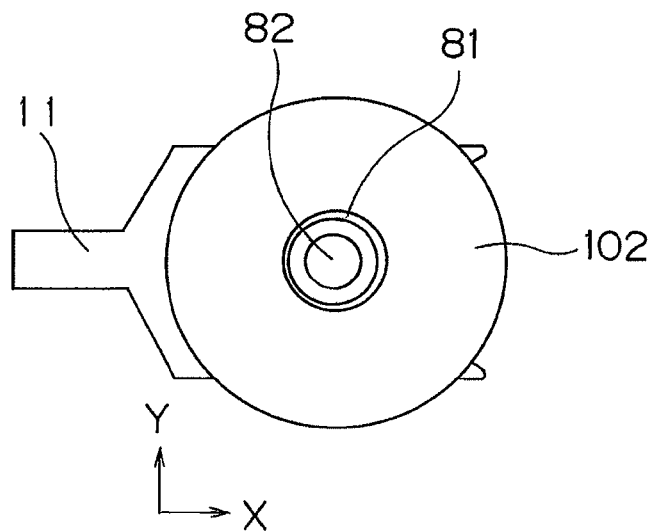
FIG. 19A is an explanatory drawing showing actions in teaching transfer positions with a transfer position teaching apparatus according to the second preferred embodiment of the present invention.
FIG. 19B is an explanatory drawing showing actions in teaching transfer positions with a transfer position teaching apparatus according to the second preferred embodiment of the present invention.
Figure 19:
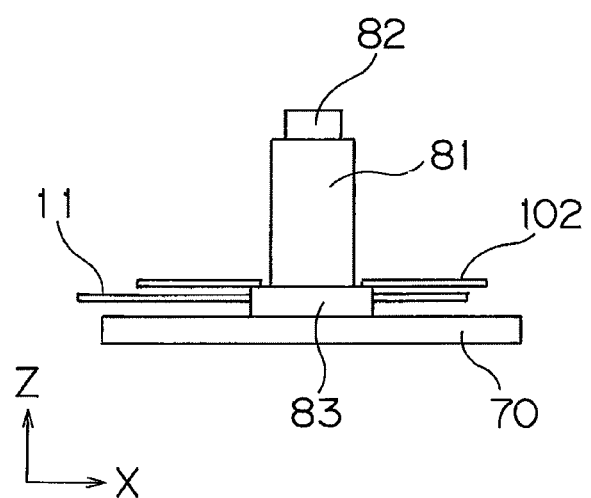

In this condition, the teaching substrate 102 is placed by moving the hand in X-direction and Y-direction shown in FIGS. 18A and 18B to execute positioning in Y-direction and X-direction so that the inner wall of the hole part formed on the teaching substrate 102 is placed outside of the body part of the contact member 81. And then as shown in FIGS. 16A and 16B, the hand 11 is moved downward, or −Z direction shown in FIG. 18, along with the teaching substrate 102.

The hand 11 is moved downward further along with the teaching substrate 102, and then as shown in FIGS. 19A and 19B, when the teaching substrate 100 contacts the upper face of the large-diameter part 83 in the contact 81, the downward movement of the hand 11 is halted at the height position. And then positional data of the hand 11 at the moment is collected from the robot controller part 24 shown in FIG. 3, identifying the position of the hand 11 at the moment, by the means of a transfer position identification part 25 in the controller part 24 shown in FIG. 3, as a transfer position of a substrate when transferring the substrate to the lowermost storing position of the substrate-storing container, while storing the position of the hand 11 at the moment in the memory part 27. With this, actions in teaching transfer positions of the substrate to the lowermost and uppermost storing positions in the substrate-storing container are finished.

Figure 20:
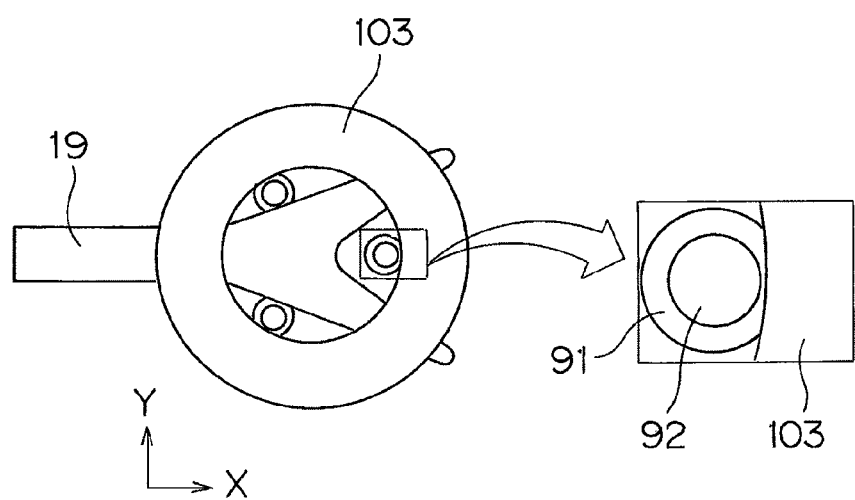
FIG. 20A is an explanatory drawing showing a variation of the transfer position teaching apparatus according to the second preferred embodiment of the present invention.
FIG. 20B is an explanatory drawing showing a variation of the transfer position teaching apparatus according to the second preferred embodiment of the present invention.
Figure 20:
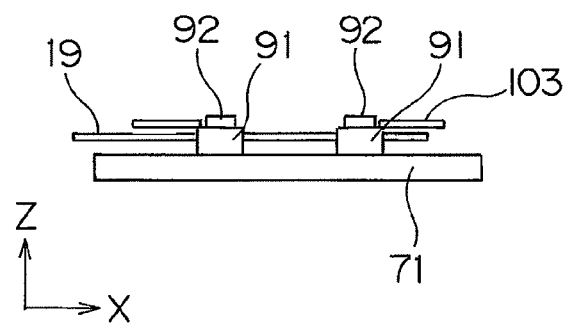

FIGS. 20A and 20B are explanatory drawings showing a variation of the transfer position teaching apparatus according to the second preferred embodiment of the present invention described hereinabove. FIG. 20A is a plan view. FIG. 20B is a side view.

In the above-described second embodiment, the positioning of the hand 11 is executed utilizing the hole parts formed on the middle of the teaching substrates 101 or 102. However, when a part of the hand is placed at a position corresponding to the hole part formed on the middle of the teaching substrates 101 or 102, interference between the hand and the contact member 81 occurs.

FIGS. 20A and 20B show an embodiment in which a part of a hand 19 is placed at the middle part of a teaching substrate 103. A hole part with relatively large diameter is formed at the middle part of the teaching substrate 103 according to the embodiment. On the base member 71, three contact members 91, each of the contact members formed with a small-diameter part 92 thereon, are vertically arranged. In using the teaching substrate 103 and contact member 91, the positioning of the hand 19 in Y-direction and X-direction is executed by making contacts between the inner side of the hole part formed on the teaching substrate 103 and outer diameter part of small-diameter parts 92 of the three contact members 91.

And then positional data of the hand 11 at the moment is collected from the robot controller part 26 shown in FIG. 3 to identify the position of the hand 19 at the moment by the means of a transfer position identification part 25 in the controller part 24 shown in FIG. 3 as a transfer position of a substrate when transferring the substrate to the lowermost storing position of the substrate-storing container, while storing the position of the hand 11 at the moment in the memory part 27. Additionally, in this variation of the second preferred embodiment, teaching of transfer position of a substrate is conducted only for the case of transferring a substrate to the lowermost storing position in a substrate-storing container.

Additionally, in the embodiments described above, the controller part 24 is directly connected with the teaching 100 as shown in FIG. 3. On the other hand, the electrical connection may be established by grounding both or either of the controller part 24 and the teaching substrate 100.

Also, shapes of substrates other than circular shapes are acceptable for the embodiments described above as long as the hand 11 and 19 can hold substrates with the shapes and contact positions between substrates and each contact member can be clearly defined.

Although the preferred embodiment of the present invention has been described in detail, the embodiment is merely a specific example used to clarify the technical contents of the present invention, and the present invention should not be understood as being limited to this specific example; and the scope of the present invention is limited solely by the appended claims.

The present application corresponds to Japanese Patent Application No. 2013-019312 filed in the Japanese Patent Office on Feb. 4, 2013, the entire disclosure of which is incorporated herein by reference.

What is claimed is:

1. A transfer position teaching apparatus for teaching a transfer position of a substrate comprising:
   a substrate transfer member;
   a hand for transferring the substrate to the substrate transfer member;
   a teaching substrate supported by the hand in place of the substrate to be transferred to the substrate transfer member; and
   a detection member, placed at a position corresponding to the substrate transfer member to detect a position of an electrical contact between the teaching substrate and the detection member,
   wherein the substrate transfer member is a substrate-storing container for storing a plurality of substrates in a stacked condition, and
   wherein the detection member includes a pair of Y-direction contact members placed correspondingly to a width of an opening of the substrate-storing container and an X-direction contact member placed correspondingly to a depth of an opening of the substrate-storing container.

2. The transfer position teaching apparatus according to claim 1, wherein the teaching substrate and the detection member have electrical conductivity and the electrical contact between the teaching substrate and the detection member is detected by a passage of electrical current between the teaching substrate and the detection member.

3. The transfer position teaching apparatus according to claim 1, wherein each of the Y-direction contact members and the X-direction contract member has a shape of a column extending vertically,
   wherein each of the Y-direction contact members and the X-direction contact member has flanges for supporting the teaching substrate at positions respectively corresponding to a substrate-storing position at an uppermost part of the substrate-storing container and a substrate-storing position at a lowermost part of the substrate-storing container.

4. The transfer position teaching apparatus according to claim 2, wherein the teaching substrate has a hole part into which the detection member is insertable.

5. The transfer position teaching apparatus of claim 1, further comprising:
   a controller part for controlling a position of a transfer robot having the hand; and
   a transfer position identification unit for identifying and storing the transfer position of the substrate based on the position of the contact between the teaching substrate and the detection member.

\* \* \* \* \*